United States Patent

Hagi et al.

[11] Patent Number: 5,828,778
[45] Date of Patent: Oct. 27, 1998

[54] METHOD AND APPARATUS FOR ANALYZING FAILURE OF SEMICONDUCTOR WAFER

[75] Inventors: Toshio Hagi; Kazuki Nakata, both of Osaka, Japan

[73] Assignee: Matsushita Electric Industrial Co., Ltd., Osaka, Japan

[21] Appl. No.: 678,879

[22] Filed: Jul. 12, 1996

[30] Foreign Application Priority Data

Jul. 13, 1995 [JP] Japan ................................. 7-177706
Sep. 4, 1995 [JP] Japan ................................. 7-226656

[51] Int. Cl.$^6$ ........................... G06K 9/00; H01L 21/66
[52] U.S. Cl. ........................... 382/145; 382/147; 438/14
[58] Field of Search ............................ 382/145, 147, 382/149, 150; 364/468.17, 468.28; 438/10, 14, 17, 21, 26; 348/86, 87, 92, 94, 95, 125, 126, 129, 130

[56] References Cited

U.S. PATENT DOCUMENTS

| | | |
|---|---|---|
| 3,751,647 | 8/1973 | Maeder et al. ................ 235/151.11 |
| 5,219,765 | 6/1993 | Yoshida et al. ...................... 438/14 |
| 5,240,866 | 8/1993 | Friedman et al. ..................... 437/8 |

FOREIGN PATENT DOCUMENTS

| | | | |
|---|---|---|---|
| 3-044054 | 2/1991 | Japan | ............ 438/14 |
| 6-275688 | 9/1994 | Japan | ............ 438/14 |

Primary Examiner—Jose L. Couso
Assistant Examiner—Duy M. Dang
Attorney, Agent, or Firm—McDermott, Will & Emery

[57] ABSTRACT

If a first pattern defect is detected at the (n−2)th step, a pattern defect is retrieved at the (n−1)th step. It is decided that all pattern defects detected at the (n−1)th step in a predetermined region where the first pattern defect is detected are generated at the (n−2)th step. If second and third pattern defects are detected in other regions than the predetermined region, it is decided that the second and third pattern defects are generated at the (n−1)th step. Then, a pattern defect at the n-th step is retrieved. It is decided that all pattern defects detected at the n-th step in a predetermined region where the second and third pattern defects are detected at the (n−1)th step are generated at the (n−1)th step. If fourth, fifth and sixth pattern defects are detected in other regions than the predetermined region where the second and third pattern defects are detected, it is decided that the fourth, fifth and sixth pattern defects are generated at the n-th step.

10 Claims, 15 Drawing Sheets

FIRST STEP
SECOND STEP
THIRD STEP
FOURTH STEP
FIFTH STEP

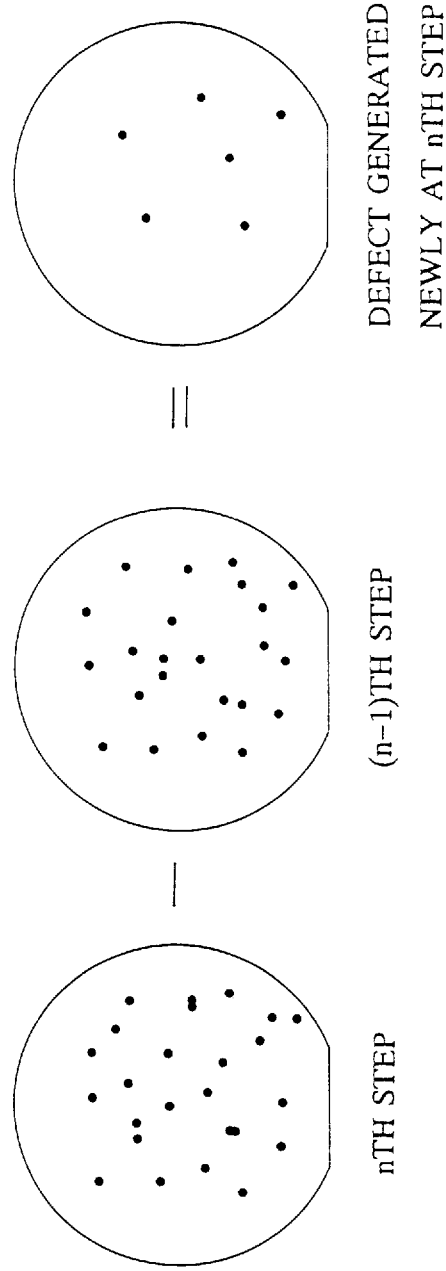

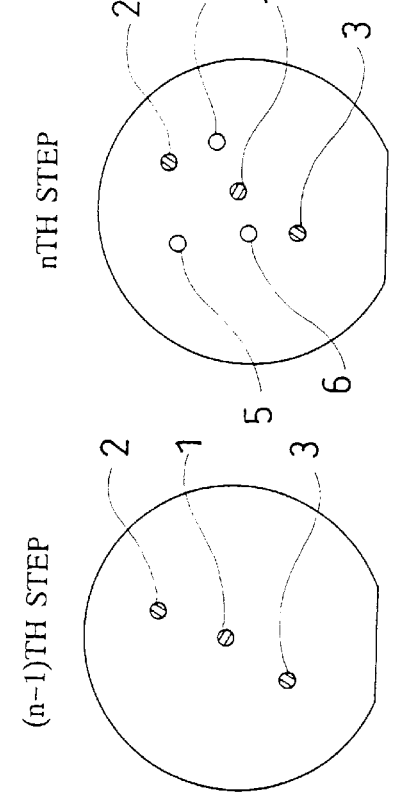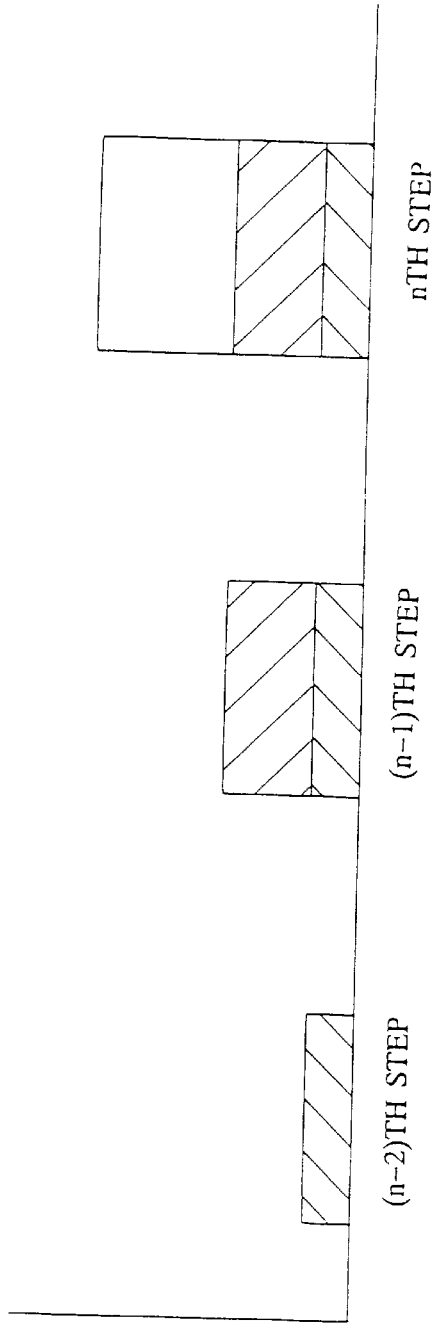

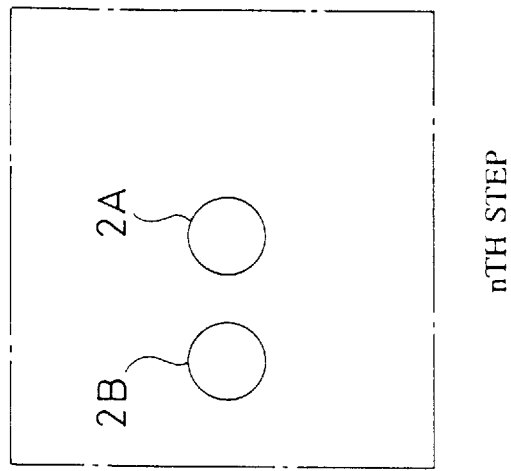
FIG. 6(b) nTH STEP
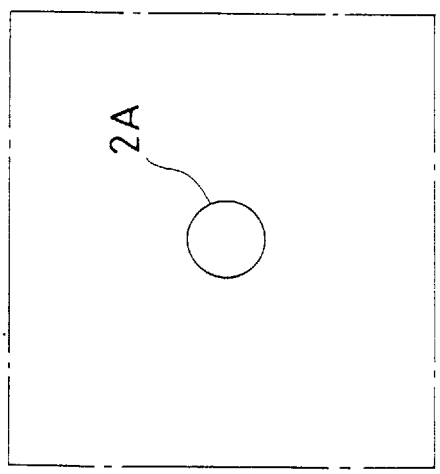
FIG. 6(a) (n−1)TH STEP

METHOD AND APPARATUS FOR ANALYZING FAILURE OF SEMICONDUCTOR WAFER

BACKGROUND OF THE INVENTION

The present invention relates to a method and apparatus for analyzing the failure of a semiconductor wafer to specify pattern defects which cause the electrical defects of a device formed on the semiconductor wafer.

Recently, it has become very hard to surely keep the profitable yield of the device with finer device patterns, more complicated structure and the longer process period. In order to enhance the yield of the device, it is important to analyze the failed device so as to make the cause of failures clear and take measures against the steps or apparatus which cause the failures. In the future, the enhancement of the method for analyzing failures will be desired still more.

There are some causes of the failures of the device. In particular, the defect which influences a pattern on the semiconductor wafer is important. For example, particles adhere onto the semiconductor wafer, focus is not suitable at the photolithography step, and etching residue is present due to the bad etching conditions.

An example of the method for analyzing failures according to the prior art will be described below with reference to the drawings.

FIG. 16 shows the flow of the example of the method for analyzing failures according to the prior art.

After the process of a semiconductor device is completed, a fail bit map which indicates the position of failed bits is made. Then, a failed bit portion is observed based on the address of the fail bit map by using an optical microscope or an electron microscope.

Subsequently, the deposited film of the failed bit portion is peeled by using a solvent such as hydrofluoric acid, phosphoric acid, hydrogen peroxide sulfate, aqua regia, potassium hydroxide or the like. Then, the failed bit portion is observed again to guess the failed steps.

If the failed steps cannot be guessed by performing the above-mentioned work, the deposited film of the failed bit portion is peeled and observed repeatedly until the failed steps can be guessed.

However, the method for analyzing failures according to the prior art has the following problems. (1) It takes about one hour per failed part in order to specify pattern defects which cause the failed bits. For this reason, it is actually hard to analyze a lot of failed bits to obtain the quantitative results of failure analysis. Consequently, the steps and apparatus against which measures should be taken are not definite. (2) Skills and experiences are required for the failure analyzing work. For this reason, the distinctive rate of a factor in failures and the results of failure analysis are varied depending on workers. (3) A solvent which is harmful to humans has to be used at the film peeling process.

In recent years, the following method has been proposed as a method for analyzing failures which avoid the above-mentioned problems.

FIG. 1 is a conceptional view showing the failure analyzing method. In FIG. 1, (a) designates a pattern defect map which represents the distribution of pattern defects for each step obtained by checking the pattern defect at each step during the process, (b) designates a fail bit map (FBM) which represents the distribution of electrical defects of a wafer which is obtained by checking electrical characteristics after the process is completed, and (c) designates the state in which the pattern defect map and the fail bit map overlap each other. In FIG. 1 (b), a point indicates a 1-bit defect portion, a line indicates a line defect portion formed by continuous bit defects, and a frame indicates a block defect portion which is formed by the bit defect portions generated like a group. FIGS. 1 (a) to 1 (c) show the defects in rectangular regions, but actually show the bit defects and pattern defects which are formed on a wafer.

The failure analyzing method according to the prior art will be described below with reference to FIGS. 1 (a) to 1 (c) and 2.

When a first step of the process for a semiconductor manufacturing device is completed, a pattern defect check for the first step is executed and a second step is started. When the second step is completed, the pattern defect check for the second step is executed and a third step is started. Such work is repeated. When a final step, that is, the zth step is completed, the pattern defect check for the zth step is executed. Then, the pattern defect map shown in FIG. 1 (a) is made and the electrical characteristics of the device are measured to make the fail bit map shown in FIG. 1 (b).

Subsequently, the pattern defect map is compared with the fail bit map to specify the pattern defects which cause the generation of failed bits and the steps of the generation thereof. In this case, the step of the generation of each pattern defect has already been distinct on the pattern defect map. Consequently, it is possible to specify the pattern defects which cause the generation of the failed bits and the steps of the generation thereof by retrieving the pattern defects on the pattern defect map corresponding to the positions of the failed bits on the fail bit map. Then, pattern defect information is fed back to the steps and apparatus where the pattern defects are generated.

A method for making the pattern defect map used in the failure analyzing method according to the prior art, and more particularly, a method for specifying the steps of generation of pattern defects on a wafer will be described below with reference to FIG. 3. The distribution of the pattern defects on the wafer obtained after the (n−1)th step is completed as shown in FIG. 3 (b) is subtracted from the distribution of the pattern defects on the wafer obtained after the n-th step is completed as shown in FIG. 3 (a). Consequently, pattern defects which are newly generated at the n-th step are specified as shown in FIG. 3 (c).

Although the present inventors actually made the pattern defect map by using the above-mentioned failure analyzing method, they could not surely specify the pattern defects which cause the failures of electrical characteristics. As a result of various investigations into the failure analyzing method, they have found the following first to fourth problems.

The first problem of the failure analyzing method according to the prior art will be described below. First of all, the method for making a pattern defect map in the failure analyzing method according to the prior art will be described below with reference to FIGS. 4 (a) to 4 (c). When a pattern defect 1 is present on the pattern defect map made at the (n−2)th step, a pattern defect is retrieved on the pattern defect map made at the (n−1)th step. When pattern defects 1, 2 and 3 are detected on the pattern defect map made at the (n−1)th step, it is decided that the pattern defects 2 and 3 are generated at the (n−1)th step because the pattern defect 1 has already been present at the (n−2)th step. Then, a pattern defect is retrieved on the pattern defect map made at the n-th step. When pattern defects 1 to 6 are found on the pattern defect map made at the n-th step, it is decided that the pattern defects 4 to 6 are generated at the n-th step because the pattern defects 1 to 3 have already been present at the (n−1)th step. Thus, it is decided that a pattern defect is generated at the (n−2)th step, two pattern defects are generated at the (n−1)th step, and three pattern defects are generated at the n-th step as shown in FIGS. 4 (*d*) to 4 (*f*).

When the steps of generation of the pattern defects are specified as described above, the following problems arise. More specifically, the actual pattern defect is not circular but warped like an image seen from the top face shown in the upper portion of FIG. 5. If the actual pattern defect is checked by using a laser scattering type pattern defect checking device and an image recognition type pattern defect checking device, a signal strength is often at the multipeak as shown in FIG. 5. For this reason, a pattern defect is recognized as only one defect or a plurality of defects depending on the steps. Even though the identification thresholds of the signal strength have the same value at the (n−1)th and n-th steps as shown by a two-dot chain line in the lower portion of FIG. 5, the detected value of the signal strength is usually varied between the (n−1)th and n-th steps by the change of the reflectance of a substrate and the like. Therefore, if the signal strength detected at the (n−1)th step has a value shown by a broken line and the signal strength detected at the n-th step has a value shown by a solid line, the pattern defect 2 shown in FIGS. 4 (*b*) and 4 (*c*) is sometimes detected as a pattern defect 2A at the (n−1)th step and detected as pattern defects 2A and 2B at the n-th step as shown in FIGS. 6 (*a*) and 6 (*b*). A dashed line shown in FIGS. 6 (*a*) and 6 (*b*) indicates a predetermined region in which the pattern defect is retrieved, for example, a square region having a side of 50 μm. In such a case, if the pattern defect 2A is found at the (n−1)th step, the pattern defect at the n-th step is retrieved in the predetermined region where the pattern defect 2A is present. If the pattern defects 2A and 2B are detected at the n-th step, it is decided that the pattern defect 2A is generated at the (n−1)th step and the pattern defect 2B is generated at the n-th step.

As described above, the defect analyzing method according to the prior art has the first problem that the pattern defect 2B is erroneously recognized to be generated also at the n-th step even though it is generated at the (n−1)th step.

The second problem of the failure analyzing method according to the prior art will be described below.

FIG. 7 shows an example of a map of pattern defects detected at the step of bit line formation of a device having a design rule of 0.5 μm. The actual pattern defect does not always have the circular and warped shapes but is a cluster-shaped pattern defect 7 in some cases as shown in FIG. 7. The cluster-shaped pattern defect 7 is seen as a flaw defect formed by handling or the like in view of the distribution status and form, and has a lot of defects generated partially and intensively. In order to cope with the cluster-shaped pattern defect 7, merge setting is performed in the usual failure analyzing method. Since the cluster-shaped pattern defects 7 are often generated due to only one cause, a plurality of defects which are distributed within the predetermined range are regarded as only one defect.

However, the cluster-shaped pattern defect 7 has various forms. As shown in FIGS. 8 (*a*) and 8 (*b*), the cluster-shaped pattern defect 7 comprises first and second groups 7A and 7B. In some cases, a comparatively large space is present between the first and second groups 7A and 7B.

As described above, the detected value of the signal strength is usually varied between the (n−1)th and the n-th steps by the change of the reflectance of the substrate and the like. By the failure analyzing method according to the prior art, therefore, the first and second groups 7A and 7B forming the cluster-shaped pattern defect 7 are merged with each other or are not merged depending on circumstances. In some cases, the cluster-shaped pattern defect 7 is seen as a defect at the (n−1)th step as shown in FIG. 8 (*a*), while the cluster-shaped pattern defect 7 is seen as two defects, that is, a pattern defect formed by the first group 7A and a pattern defect formed by the second group 7B at the n-th step as shown in FIG. 8 (*b*). For this reason, it is erroneously recognized that a new pattern defect formed by the first group 7A of the cluster-shaped pattern defect 7 is generated at the n-th step even though the new pattern defect is not generated at the n-th step.

The defect coordinates of the cluster-shaped pattern defect 7 are in a position shown in FIG. 8 (*a*) at the (n−1)th step, and in a position shown in FIG. 8 (*b*) at the n-th step. If a space between the defect coordinates shown in FIGS. 8 (*a*) and 8 (*b*) is greater than a predetermined region (shown by a dashed line in FIGS. 6 (*a*) and 6 (*b*)) in which the pattern defect is retrieved, it is sometimes decided that the first and second groups 7A and 7B forming the cluster-shaped pattern defect 7 are generated at the n-th step.

As described above, the failure analyzing method according to the prior art has the second problem that the step of generation of the pattern defect, the number of the generated pattern defects and the position of generation are erroneously recognized for the cluster-shaped pattern defect.

The third problem of the failure analyzing method according to the prior art will be described below.

In order to cause the coordinate system of the fail bit map (FBM) to be coincident with that of the pattern defect map, it is necessary to convert the failed data of the FBM into correlation comparison format. FIG. 9 (*a*) shows the correlation comparison format. In FIG. 9 (*a*), the reference numeral 10 designates a 1-die FBM, the reference numeral 11 designates a 1-bit failure portion having coordinates ($x_1$, $y_1$), and the reference numerals 12A and 12B designate line failure portions (in which failed bits are continuously arranged in a line) having central coordinates of ($x_2$, $y_2$) and ($x_3$, $y_3$).

FIG. 9 (*b*) shows a method for displaying the size of the 1-bit failure portion 11. FIG. 9 (*c*) shows a method for displaying the size of the line failure portion 12A or 12B. Thus, the failed data of the FBM is expressed by the coordinates from an origin of the 1-die FBM 10 (which is coincident with the origin of the pattern defect map), and the sizes of x and y of the 1-bit failure portion 11 and line failure portions 12A and 12B.

A method for comparing the 1-bit failure portion 11 with the pattern defect map will be described below with reference to FIG. 10. In FIG. 10, the reference numeral 13 designates a retrieval region in which the pattern defect that causes the generation of the 1-bit failure portion 11 is retrieved, and the reference numerals 14A and 14B designate pattern defects which are present in the retrieval region 13. For example, the retrieval region 13 is set to 50 μm or less in which the origin is the central coordinates ($x_1$, $y_1$) of the 1-bit failure portion 11 in consideration of the coordinate specifying precision of the failure analyzing apparatus. A pattern defect of the pattern defects 14A and 14B present in the retrieval region 13 which is the closest to the central coordinates ($x_1$, $y_1$) of the 1-bit failure portion 11 is specified as a pattern defect which causes failures. The line failure portions 12A and 12B are compared with the pattern defect map basically in the same manner as the case where the 1-bit failure portion 11 is compared with the pattern defect map. A pattern defect which is the closest to the central coordinates of the line failure portions 12A and 12B is specified as a pattern defect which causes failures.

The steps of generation of the pattern defects were retrieved by using the failure analyzing method described above. In some cases, the line failure portions 12A and 12B do not correspond to the pattern defects. Consequently, the third problem arises in which the pattern defect that causes line failures is erroneously recognized.

The fourth problem of the failure analyzing method according to the prior art will be described below.

In the failure analyzing method according to the prior art, a pattern defect which is located closest to the center of the bit failure portion is specified as a pattern defect which causes failures. For this reason, in the case where a pattern defect having a small size, for example, a pattern defect having a size which is smaller than the distance between wiring patterns is located close to the bit failure portion and a pattern defect having a great size, for example, a pattern defect having a size which is greater than the distance between the wiring patterns is located far from the bit failure portion, a pattern defect having a small size which does not actually cause failures is erroneously recognized as a pattern defect which causes the failures.

SUMMARY OF THE INVENTION

It is a first object of the present invention to precisely grasp the steps of generation of pattern defects.

It is a second object of the present invention to precisely grasp the steps of generation of cluster-shaped pattern defects, the number of the generated cluster-shaped pattern defects, and the position of generation.

It is a third object of the present invention to accurately specify a pattern defect which causes the generation of line failures if the line failures are generated.

It is a fourth object of the present invention to accurately specify a pattern defect which causes failures if pattern defects having various sizes are present.

In order to accomplish the first object, the present invention provides a first method for analyzing the failure of a semiconductor wafer comprising a first step of checking the pattern defect of the semiconductor wafer to make a pattern defect map which represents the distribution of the pattern defects at each process of semiconductor manufacture, a second step of making a fail bit map which represents the distribution of electrical defects after the each process of semiconductor manufacture is completed, and a third step of specifying a process at which a pattern defect that causes the electrical defects is generated by comparing the pattern defect map made at the first step with the fail bit map made at the second step, the third step including the step of retrieving pattern defects on a first pattern defect map made at the (n−1)th process and a second pattern defect map made at the n-th process to decide that all the pattern defects detected on the second pattern defect map in a predetermined region within a predetermined distance from the position of each pattern defect detected on the first pattern defect map are generated at a process prior to the (n−1)th process, and that pattern defects detected on the second pattern defect map in other regions than the each predetermined region are generated at the n-th process.

According to the first method for analyzing the failure of a semiconductor wafer, also in the case where the pattern defect generated at the (n−1)th process is warped and is detected as a pattern defect on the first pattern defect map made at the (n−1)th process and as a plurality of pattern defects on the second pattern defect map made at the n-th process, the pattern defects are detected in a predetermined region within a predetermined distance from the position of the pattern defect detected on the first pattern defect map. Consequently, it is decided that the pattern defects are generated at a process prior to the (n−1)th process. Thus, the pattern defects are not erroneously recognized to be generated at the n-th process.

In order to accomplish the first object, the present invention provides a second method for analyzing the failure of a semiconductor wafer comprising a first step of checking the pattern failure of the semiconductor wafer to make a pattern defect map which represents the distribution of the pattern defects at each process of semiconductor manufacture, a second step of making a fail bit map which represents the distribution of electrical defects after the each process of semiconductor manufacture is completed, and a third step of specifying a process at which a pattern defect that causes the electrical defects is generated by comparing the pattern defect map made at the first step with the fail bit map made at the second step, the third step including the step of retrieving pattern defects on a first pattern defect map made at the (n−1)th process and a second pattern defect map made at the n-th process respectively to decide that the pattern defects on the second pattern defect map which are not detected on the first pattern defect map in each predetermined region within a predetermined distance from the position of the pattern defect detected on the second pattern defect map are generated at the n-th process, and that the pattern defects on the second pattern defect map detected on the first pattern defect map in the each predetermined region are generated at a process prior to the (n−1)th process.

According to the second method for analyzing the failure of a semiconductor wafer, also in the case where the pattern defect generated at the (n−1)th process is warped and is detected as a pattern defect on the first pattern defect map made at the (n−1)th process and as a plurality of pattern defects on the second pattern defect map made at the n-th process, the pattern defects are detected also on the first pattern defect map in a predetermined region within a predetermined distance from the position of the pattern defect detected on the second pattern defect map. Consequently, it is decided that the pattern defects are generated at a process prior to the (n−1)th process. Thus, the pattern defects are not erroneously recognized to be generated at the n-th process.

According to first or second method for analyzing the failure of a semiconductor wafer, also in the case where the pattern defect generated at the (n−1)th process is warped, and is detected as a pattern defect at the n-th process and as a plurality of pattern defects at the n-th process, it is decided that the pattern defects are generated at a process prior to the (n−1)th process. Thus, the pattern defects are not erroneously recognized to be generated at the n-th process. Thus, it is possible to accurately specify the step of generation of the warped pattern defect.

In order to accomplish the second object, the present invention provides a third method for analyzing the failure of a semiconductor wafer comprising a first step of checking the pattern defect of the semiconductor wafer to make a pattern defect map which represents the distribution of the pattern defects at each process of semiconductor manufacture, a second step of making a fail bit map which represents the distribution of electrical defects after the each process of semiconductor manufacture is completed, and a third step of specifying a process at which a pattern defect that causes the electrical defects is generated by comparing the pattern defect map made at the first step with the fail bit map made at the second step, the third step including the step of retrieving the pattern defects on the pattern defect map to merge, as a pattern defect, one of a plurality of pattern defects and other pattern defects detected in a region within a distance of 0.25 to 1.5 μm from the pattern defect if the plurality of pattern defects are detected.

According to the third method for analyzing the failure of a semiconductor wafer, if a plurality of pattern defects are detected, one of the pattern defects and other pattern defects detected in a region within a distance of 0.25 to 1.5 μm from the pattern defect are merged as a pattern defect. Consequently, the number of cluster-shaped pattern defects does not become enormous. It is possible to prevent an excessive increase in time for failure analysis processing and to decrease the variation error of the central position of the cluster-shaped pattern defects. Thus, it is possible to precisely grasp the steps of generation of the cluster-shaped pattern defects, the number of the cluster-shaped pattern defects, and the position of generation.

In order to accomplish the third object, the present invention provides a fourth method for analyzing the failure of a semiconductor wafer comprising a first step of checking the pattern defect of the semiconductor wafer to make a pattern defect map which represents the distribution of the pattern defects at each process of semiconductor manufacture, a second step of making a fail bit map which represents the distribution of electrical defects after the each process of semiconductor manufacture is completed, and a third step of specifying a process at which a pattern defect that causes the electrical defects is generated by comparing the pattern defect map made at the first step with the fail bit map made at the second step, the third step including the step of deciding that a pattern defect located closest to the central line of a line failure portion having a plurality of continuous failed bits, which is detected in a region within a predetermined distance from the central line of the line failure portion on the pattern defect map, causes the generation of the line failure portion if the line failure portion is detected on the fail bit map.

According to the fourth method for analyzing the failure of a semiconductor wafer, the pattern defect located closest to the central line of the line failure portion, which is detected in a region within a predetermined distance from the central line, is specified as a pattern defect which causes the generation of the line failure portion. Consequently, it is possible to avoid specifying, as the cause of generation of the line failures, the pattern defect generated in a position close to the central point of the line failure portion and far from the central line thereof. Accordingly, the pattern defect generated in a position close to the central point of the line failure portion and far from the central line thereof is not erroneously recognized as the cause of generation of the line failures. Consequently, it is possible to accurate specify the pattern defect which is generated in a position close to the central line of the line failure portion and causes the generation of the line failures.

In order to accomplish the fourth object, the present invention provides a fifth method for analyzing the failure of a semiconductor wafer comprising a first step of checking the pattern defect of the semiconductor wafer to make a pattern defect map which represents the distribution of the pattern defects at each process of semiconductor manufacture, a second step of making a fail bit map which represents the distribution of electrical defects after the each process of semiconductor manufacture is completed, and a third step of specifying a process at which a pattern defect that causes the electrical defects is generated by comparing the pattern defect map made at the first step with the fail bit map made at the second step, the third step including the steps of obtaining, in advance, the relationship between the size of a pattern defect and a probability that a pattern defect causes electrical defects, and multiplying a distance between a plurality of pattern defects detected in a region within a predetermined distance from the center of a failed bit on the fail bit map or the central line of a line failure portion formed by a plurality of continuous failed bits and the center of the failed bit or the central line of the line failure portion by an inverse number of the probability corresponding to the size of the pattern defect detected in the region within a predetermined distance so as to find corrected distances respectively and to decide that a pattern defect corresponding to the corrected distance having the smallest value causes electrical defects.

According to the fifth method for analyzing the failure of a semiconductor wafer, in the case where a great pattern defect is present in a position at a relatively great distance from the center of the failed bit or the central line of the line failure portion and a small pattern defect is present in a position at a relatively small distance from the center of the failed bit or the central line of the line failure portion, the great pattern defect has a great probability that it causes electrical defects so that the corrected distance of the great pattern defect is decreased, and the small pattern defect has a small probability that it causes the electrical defects so that the corrected distance of the small pattern defect is increased. Consequently, the corrected distance of the great pattern defect is less than that of the small pattern defect. Accordingly, the pattern defect which is present close to the failed bit or the line failure portion and hardly causes failures because of its small size is not erroneously recognized as the cause of failures. Thus, it is possible to accurately specify the pattern defect which causes the failures.

In order to accomplish the first object, the present invention provides a first apparatus for analyzing the failure of a semiconductor wafer comprising pattern defect map making means for checking the pattern defect of the semiconductor wafer to make a pattern defect map which represents the distribution of the pattern defects at each process of semiconductor manufacture, fail bit map making means for making a fail bit map which represents the distribution of electrical defects after the each process of semiconductor manufacture is completed, and pattern defect generation step specifying means for specifying a process at which a pattern defect that causes the electrical defects is generated by comparing the pattern defect map made by the pattern defect map making means with the fail bit map made by the fail bit map making means, the pattern defect generation step specifying means including means for retrieving pattern defects on a first pattern defect map made at the (n−1)th process and a second pattern defect map made at the n-th process respectively, and means for deciding that all the pattern defects detected on the second pattern defect map in each predetermined region within a predetermined distance from the position of each pattern defect detected on the first pattern defect map are generated at a process prior to the (n−1)th process, and that pattern defects detected on the second pattern defect map in other regions than the each predetermined region are generated at the n-th process.

According to the first apparatus for analyzing the failure of a semiconductor wafer, the pattern defect generated at the (n−1)th process is not erroneously recognized to be generated at the n-th process even though it is warped in the same manner as in the first method for analyzing the failure of a semiconductor wafer. Consequently, it is possible to accurately specify the step of generation of the warped pattern defect.

In order to accomplish the first object, the present invention provides a second apparatus for analyzing the failure of a semiconductor wafer comprising pattern defect map making means for checking the pattern defect of the semiconductor wafer to make a pattern defect map which represents the distribution of the pattern defects at each process of semiconductor manufacture, fail bit map making means for making a fail bit map which represents the distribution of electrical defects after the each process of semiconductor manufacture is completed, and pattern defect generation step specifying means for specifying a process at which a pattern defect that causes the electrical defects is generated by comparing the pattern defect map made by the pattern defect map making means with the fail bit map made by the fail bit map making means, the pattern defect generation step specifying means including means for retrieving pattern defects on a first pattern defect map made at the (n−1)th process and a second pattern defect map made at the n-th process respectively, and means for deciding that pattern defects on the second pattern defect map which are not detected on the first pattern defect map in each predetermined region within a predetermined distance from the position of the pattern defect detected on the second pattern defect map are generated at the n-th process, and that the pattern defects on the second pattern defect map detected on the first pattern defect map in the each predetermined region are generated at a process prior to the (n−1)th process.

According to the second apparatus for analyzing the failure of a semiconductor wafer, the pattern defect generated at the (n−1)th process is not erroneously recognized to be generated at n-th process even though it is warped in the same manner as in the second method for analyzing the failure of a semiconductor wafer. Consequently, it is possible to accurately specify the step of generation of the warped pattern defect.

In order to accomplish the second object, the present invention provides a third apparatus for analyzing the failure of a semiconductor wafer comprising pattern defect map making means for checking the pattern defect of the semiconductor wafer to make a pattern defect map which represents the distribution of the pattern defects at each process of semiconductor manufacture, fail bit map making means for making a fail bit map which represents the distribution of electrical defects after the each process of semiconductor manufacture is completed, and pattern defect generation step specifying means for specifying a process at which a pattern defect that causes the electrical defects is generated by comparing the pattern defect map made by the pattern defect map making means with the fail bit map made by the fail bit map making means, the pattern defect generation step specifying means including means for retrieving pattern defects on the pattern defect map to merge, as a pattern defect, one of a plurality of pattern defects and other pattern defects detected in a region within a distance of 0.25 to 1.5 $\mu$m from the pattern defect if the plurality of pattern defects are detected.

According to the third apparatus for analyzing the failure of a semiconductor wafer, it is possible to avoid making the number of pattern defects enormous and to decrease the variation error of the central positions of the cluster-shaped pattern defects in the same manner as in the third method for analyzing the failure of a semiconductor wafer. Consequently, it is possible to avoid an excessive increase in time for failure analysis processing and to precisely grasp the steps of generation of the cluster-shaped pattern defects, the number of the generated cluster-shaped pattern defects, and the position of generation.

In order to accomplish the third object, the present invention provides a fourth apparatus for analyzing the failure of a semiconductor wafer comprising pattern defect map making means for checking the pattern defect of the semiconductor wafer to make a pattern defect map which represents the distribution of the pattern defects at each process of semiconductor manufacture, fail bit map making means for making a fail bit map which represents the distribution of electrical defects after the each process of semiconductor manufacture is completed, and pattern defect generation step specifying means for specifying a process at which a pattern defect that causes the electrical defects is generated by comparing the pattern defect map made by the pattern defect map making means with the fail bit map made by the fail bit map making means, the pattern defect generation step specifying means including means for deciding that a pattern defect located closest to the central line of a line failure portion having a plurality of continuous failed bits, which is detected in a region within a predetermined distance from the central line of the line failure portion on the pattern defect map, causes the generation of the line failure portion if the line failure portion is detected on the fail bit map.

According to the fourth apparatus for analyzing the failure of a semiconductor wafer, it is possible to avoid specifying, as the cause of generation of the line failures, the pattern defect generated close to the central point of the line failure and far from the central line thereof in the same manner as in the fourth apparatus for analyzing the failure of a semiconductor wafer. Consequently, it is possible to accurately specify the pattern defect which is generated close to the central line of the line failure portion and causes the generation of the line failures.

In order to accomplish the fourth object, the present invention provides a fifth apparatus for analyzing the failure of a semiconductor wafer comprising pattern defect map making means for checking the pattern defect of the semiconductor wafer to make a pattern defect map which represents the distribution of the pattern defects at each process of semiconductor manufacture, fail bit map making means for making a fail bit map which represents the distribution of electrical defects after the each process of semiconductor manufacture is completed, and pattern defect generation step specifying means for specifying a process at which a pattern defect that causes the electrical defects is generated by comparing the pattern defect map made by the pattern defect map making means with the fail bit map made by the fail bit map making means, the pattern defect generation step specifying means including means for obtaining, in advance, the relationship between the size of a pattern defect and a probability that a pattern defect causes electrical defects, and means for multiplying a distance between a plurality of pattern defects detected in a region within a predetermined distance from the center of a failed bit on the fail bit map or the central line of a line failure portion formed by a plurality of continuous failed bits and the center of the failed bit or the central line of the line failure portion by an inverse number of the probability corresponding to the size of the pattern defect detected in the region within a predetermined distance so as to find corrected distances respectively and to decide that a pattern defect corresponding to the corrected distance having the smallest value causes electrical defects.

According to the fifth apparatus for analyzing the failure of a semiconductor wafer, the corrected distance of the great pattern defect is decreased and that of the small pattern defect is increased so that the corrected distance of the great pattern defect is less than that of the small pattern defect in the same manner as in the fifth method for analyzing the failure of a semiconductor wafer. Consequently, it is possible to accurately specify the pattern defect which causes the failures.

These and other objects, features, aspects and advantages of the present invention will become more apparent from the following detailed description of the present invention when taken in conjunction with the accompanying drawings.

BRIEF DESCRIPTION OF THE DRAWINGS

The present invention will be detailed in conjunction with the accompanying drawings in which:

FIGS. 3 (a) to 3 (c) are views showing the steps of making a pattern defect map in the method for analyzing the failure of a semiconductor wafer according to the prior art and the present invention;

FIGS. 4 (a) to 4 (f) are views showing the step of making a pattern defect map in the method for analyzing the failure of a semiconductor wafer according to the prior art and the present invention;

FIGS. 6 (a) and 6 (b) are views showing the steps of making a pattern defect map in the method for analyzing the failure of a semiconductor wafer according to the prior art and the present invention;

Figure 1A:
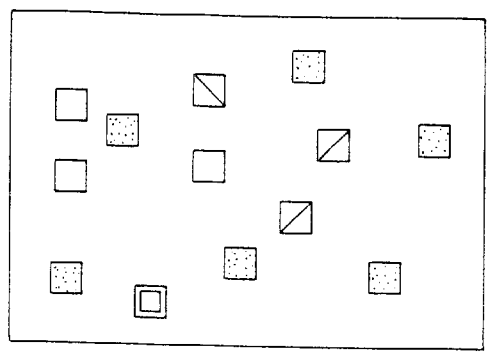
FIGS. 1 (a) to 1 (c) are conceptional views showing a method for analyzing the failure of a semiconductor wafer according to the prior art and the present invention.
Figure 1C:
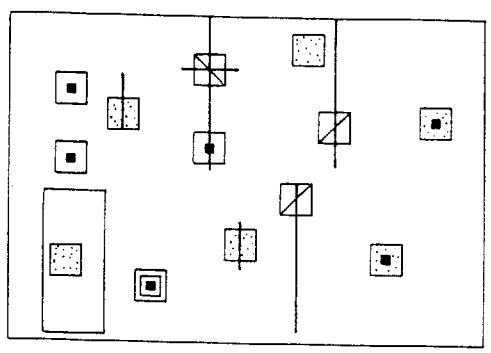
Figure 1B:
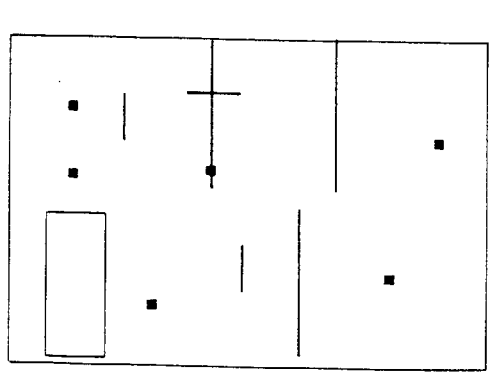
Figure 2:
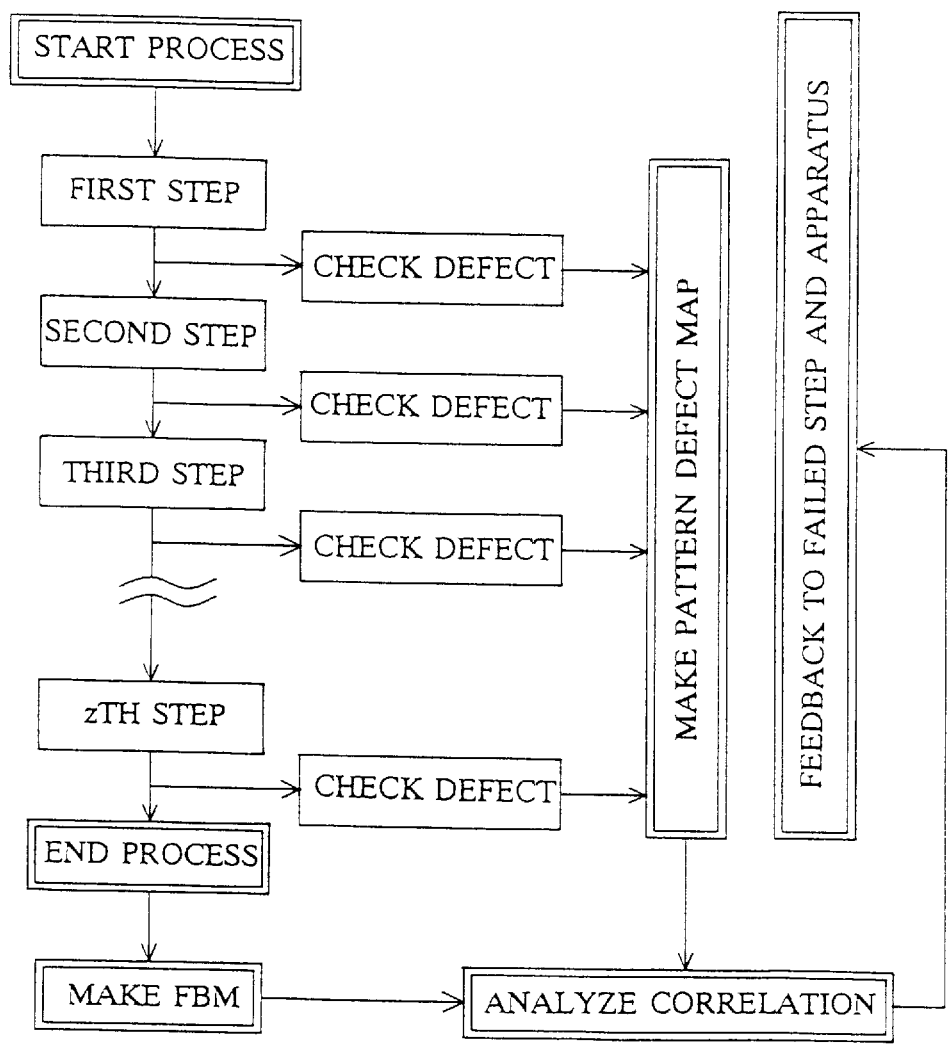
FIG. 2 is a flow chart showing the method for analyzing the failure of a semiconductor wafer according to the prior art and the present invention.
Figure 5:
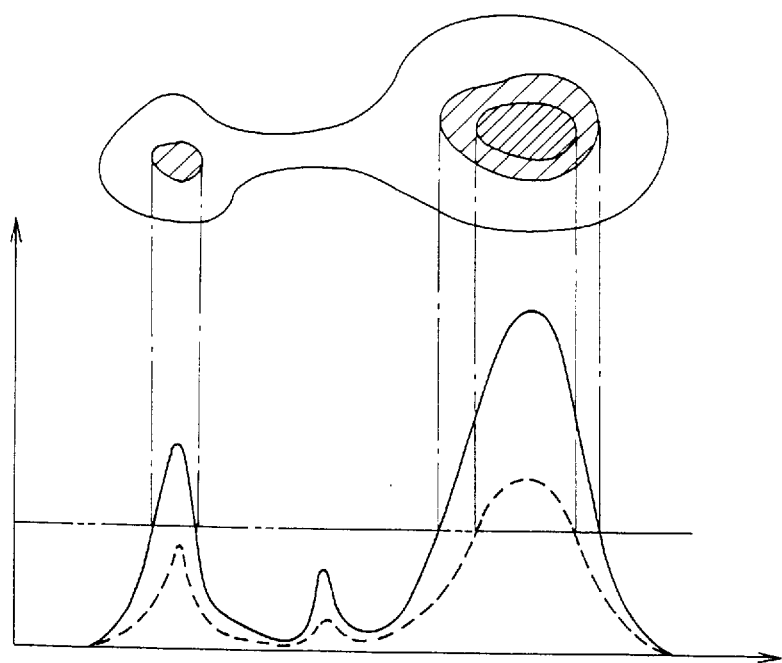
FIG. 5 is a chart showing the case where a pattern defect is recognized as a plurality of pattern defects in the method for analyzing the failure of a semiconductor wafer according to the prior art and the present invention.
Figure 7:
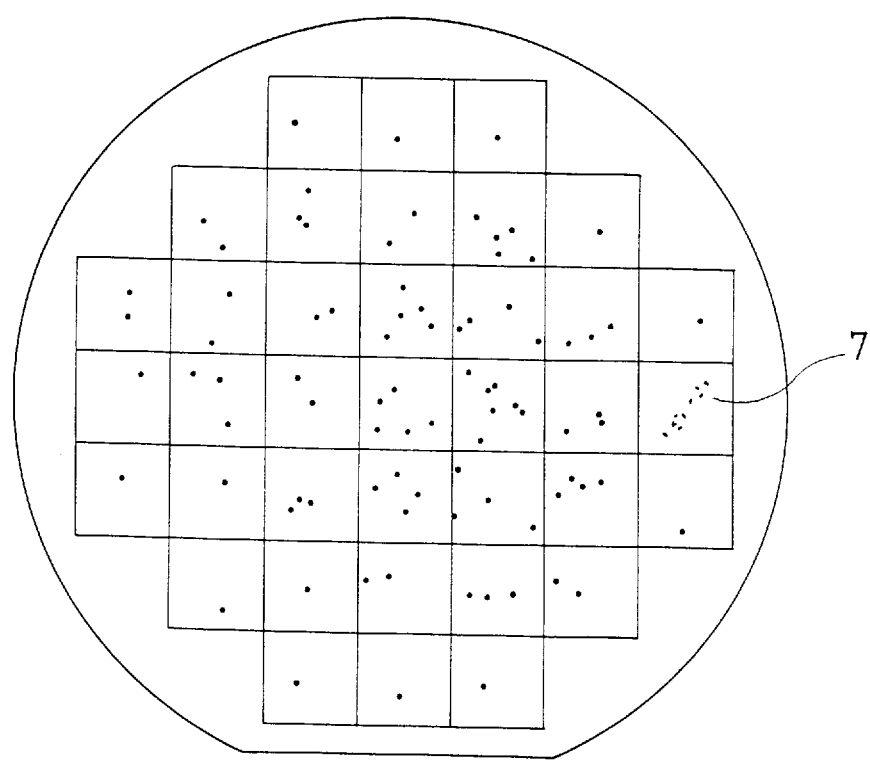
FIG. 7 is a view showing cluster-shaped pattern defects formed on the semiconductor wafer.

DETAILED DESCRIPTION OF THE INVENTION (First Embodiment)

A first embodiment will be described below with reference to FIGS. 4 (a) to 4 (f). The first embodiment accomplishes the first object described above.

The first embodiment has the following features. When a pattern defect 1 is present on a pattern defect map made at the (n−2)th step, a pattern defect is retrieved on a pattern defect map made at the (n−1)th step. It is decided that all pattern defects detected in a predetermined region where the pattern defect 1 is present, for example, in a square region having a side of 50 $\mu$m are generated at the (n−2)th step. When pattern defects 2 and 3 are detected in other regions than the predetermined region where the pattern defect 1 is present, it is decided that the pattern defects 2 and 3 are generated at the (n−1)th step. More specifically, when the pattern defect is detected at the (n−1)th step in the predetermined region where the pattern defect 1 is present, it is decided that other pattern defects are generated at the (n−2)th step even though they are not actually generated at the (n−2)th step. According to the prior art, when the pattern defect 1 is detected at the (n−1)th step in the predetermined region where the pattern defect 1 generated at the (n−2)th step is present, it is decided that the pattern defect 1 is generated at the (n−2)th step and that other pattern defects than the pattern defect 1 present in the predetermined region are generated at the (n−1)th step. According to the first embodiment, it is decided that all the pattern defects detected in the predetermined region where the pattern defect 1 generated at the (n−2)th step is present are generated at the (n−2)th step.

When the pattern defects 2 and 3 are detected on the pattern defect map made at the (n−1)th step, a pattern defect is retrieved on a pattern defect map made at the n-th step. It is decided that all pattern defects detected in a predetermined region where the pattern defects 2 and 3 are present, for example, in a square region having a side of 50 $\mu$m are generated at the (n−1)th step. When pattern defects 4, 5 and 6 are detected in other regions than the predetermined region where the pattern defects 2 and 3 are present, it is decided that the pattern defects 4, 5 and 6 are generated at the n-th step.

In case of the distribution of pattern defects shown in FIGS. 4 (a) to 4 (f), the prior art and the first embodiment have almost the same effects. In case of the distribution of pattern defects shown in FIGS. 6 (a) and 6 (b), the effects obtained in the prior art and the first embodiment are very different from each other. Actually, the pattern defects 2A and 2B are generated at the (n−1)th step. If only the pattern defect 2A is detected at the (n−1)th step and the pattern defects 2A and 2B are detected at the n-th step, a pattern defect is retrieved on the pattern defect map made at the n-th step in the predetermined region where the pattern defect 2A is present because the pattern defect 2A is detected at the (n−1)th step. Since the pattern defects 2A and 2B are detected on the pattern defect map at the n-th step, it is decided that the pattern defects 2A and 2B are generated at the (n−1)th step. Consequently, the situation in which the pattern defect 2B is erroneously recognized to be generated at the n-th step is avoided so that the first problem of the prior art can be solved.

If two pattern defects are detected in a predetermined region at the (n−1)th step and a pattern defect is detected in a predetermined region at the n-th step, it is decided that the pattern defects detected at the (n−1)th step are generated at the (n−1)th step. Consequently, there is no problem.

(Second Embodiment)

A second embodiment will be described below with reference to FIGS. 4 (a) to 4 (f). The second embodiment also accomplishes the first object described above.

When pattern defects 1 to 6 are detected on a pattern defect map made at the n-th step, pattern defects are retrieved on pattern defect maps made at the (n−2)th and (n−1)th steps in predetermined regions where the pattern defects 1 to 6 are present. Since the pattern defect 1 is detected at the (n−2)th and (n−1)th steps, it is decided that the pattern defect 1 is generated at the (n−2)th step. Since the pattern defects 2 and 3 are not detected at the (n−2)th step but detected at the (n−1)th step, it is decided that the pattern defects 2 and 3 are generated at the (n−1)th step. Since the pattern defects 4 to 6 are not detected at the (n−1)th step, it is decided that the pattern defects 4 to 6 are generated at the n-th step.

The distribution of pattern defects shown in FIGS. 6 (a) and 6 (b) will be described below. When pattern defects 2A and 2B are detected in predetermined regions at the n-th step, pattern defects are retrieved on the defect maps made at the (n−2)th and (n−1)th steps in the predetermined regions where the pattern defects 2A and 2B are present. If the pattern defects 2A and 2B are detected at the (n−2)th and (n−1)th steps, it is decided that the pattern defects 2A and 2B are generated at the (n−2)th step. If the pattern defects 2A and 2B are not detected at the (n−2)th step but detected at the (n−1)th step, it is decided that the pattern defects 2A and 2B are generated at the (n−1)th step. If the pattern defects 2A and 2B are not detected at the (n−1)th step, it is decided that the pattern defects 2A and 2B are generated at the n-th step.

Actually, the pattern defects 2A and 2B are generated at the (n−1)th step. If only the pattern defect 2A is detected at the (n−1)th step and the pattern defects 2A and 2B are detected at the n-th step, it is decided that not only the pattern defect 2A but also the pattern defect 2B are generated at the (n−1)th step because the pattern defect 2A is detected at the (n−1)th step in the predetermined regions where the pattern defects 2A and 2B detected at the n-th step are present. Thus, the step at which the pattern defect is generated can be specified accurately. Consequently, the first problem of the prior art can be solved.

(Third Embodiment)

A third embodiment will be described below with reference to FIGS. 4 (a) to 4 (f). The third embodiment also accomplishes the first object described above.

When pattern defects 1 to 6 are detected on a pattern defect map made at the n-th step, pattern defects are retrieved on a pattern defect map made at the (n−1)th step in predetermined regions where the pattern defects 1 to 6 are present. Since the pattern defects 1, 2 and 3 are detected at the (n−1)th step but the pattern defects 4, 5 and 6 are not detected at the (n−1)th step, it is decided that the pattern defects 4, 5 and 6 are generated at the n-th step. For the present, it is decided that the pattern defects 1, 2 and 3 are generated at the (n−1)th step. Then, the pattern defects are retrieved on a pattern defect map made at the (n−2)th step in the predetermined regions where the pattern defects 1, 2 and 3 are detected. Since the pattern defect 1 is detected but the pattern defects 2 and 3 are not detected at the (n−2)th step. Consequently, it is decided that the pattern defects 2 and 3 are generated at the (n−1)th step and that the pattern defect 1 is generated at the (n−2)th step.

Thus, the first problem of the prior art can be solved in the same manner as in the second embodiment.

In the third embodiment, measures can be surely taken as follows. More specifically, a flag "n" is raised, for the present, on all the pattern defects 1 to 6 which are generated at the n-th step, "n" is changed to "n−1" for the pattern defects 1 to 3 generated at the (n−1)th step, and "n−1" is changed to "n−2" for the pattern defect 1 generated at the (n−2)th step.

(Fourth Embodiment)

A fourth embodiment will be described below with reference to FIGS. 8 (a) and 8 (b). The fourth embodiment accomplishes the second object described above.

The fourth embodiment limits a merge set value for a pattern defect checking method and a merge set value for the merge function of a pattern defect checking device. The lower and upper bounds of the merge set value will be investigated below.

As the merge set value is decreased, the variation error of the central coordinates of the pattern defect which is obtained by merging defect groups forming a cluster-shaped pattern defect 7 is reduced. Consequently, it is possible to accurately grasp the position of generation of the cluster-shaped pattern defect and to precisely recognize the steps of generation of the cluster-shaped pattern defect 7 and the number of the generated cluster-shaped pattern defects 7. However, a defect group having a space of 0.25 $\mu$m or more is counted for a pattern defect as a whole when the merge set value is less than 0.25 $\mu$m. Consequently, the number of the cluster-shaped pattern defects becomes enormous so that the time for processing of a failure analyzing method is increased. As a result, practical checking cannot be performed.

Figures 8A, 8B:
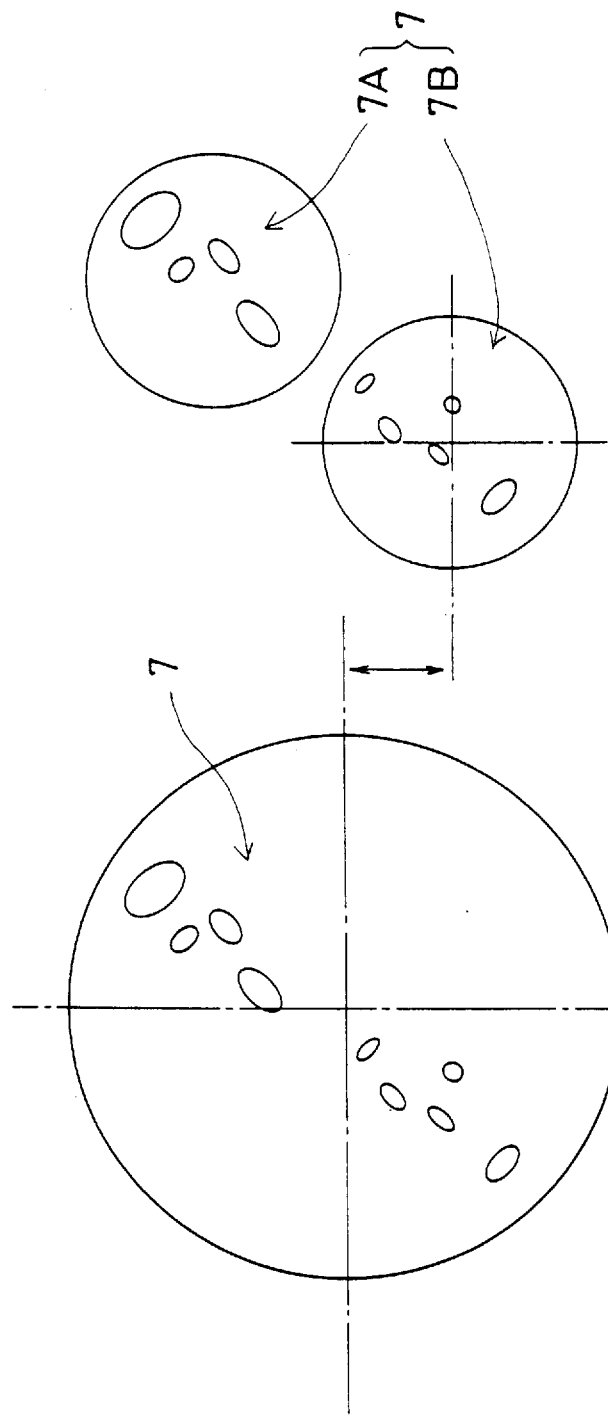
FIGS. 8 (a) and 8 (b) are views showing the steps of making a pattern defect map when the cluster-shaped pattern defects are generated in the method for analyzing the failure of a semiconductor wafer according to the prior art and the present invention.
Figure 9A:
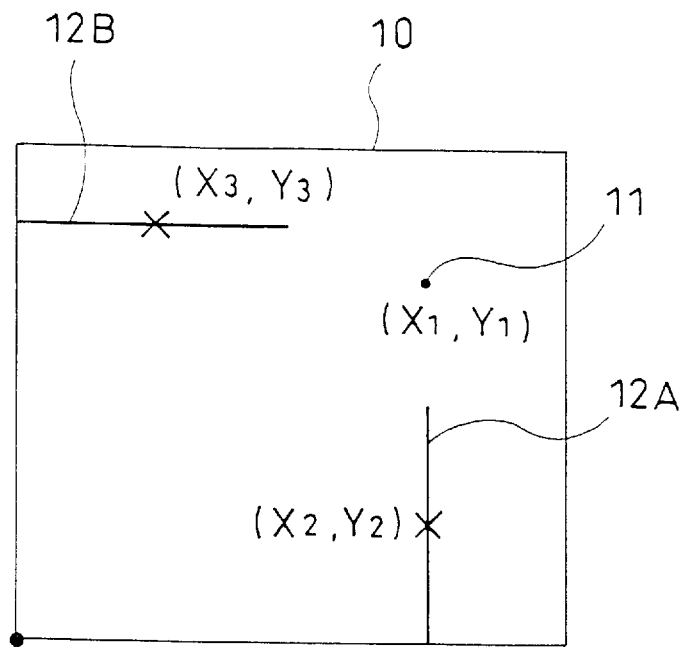
FIGS. 9 (a) to 9 (c) are diagrams showing a method for converting failed data on a fail bit map into correlation comparison format in the method for analyzing the failure of a semiconductor wafer according to the prior art and the present invention.
Figure 9B:
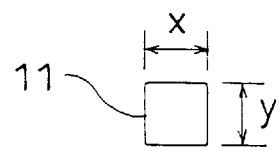
Figure 9C:
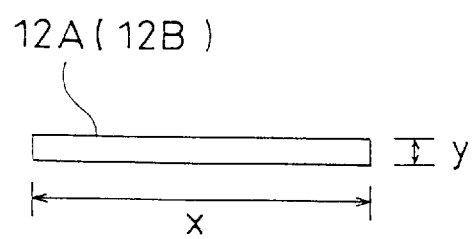
Figure 10:
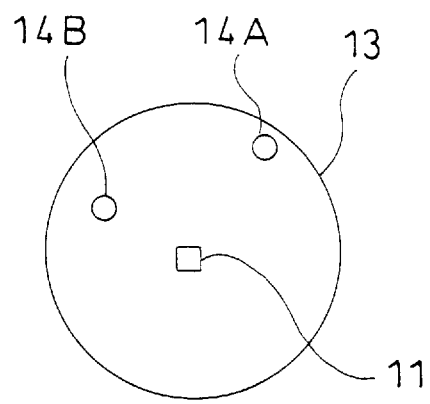
FIG. 10 is a diagram showing a method for specifying pattern defects which cause a 1-bit failure portion on the fail bit map in the method for analyzing the failure of a semiconductor wafer according to the prior art.

When the merge set value is more than 1.5 $\mu$m, first and second groups 7A and 7B forming the cluster-shaped pattern defect 7 which are shown in FIG. 8 (b) are not merged as described in the clause of the prior art for the cluster-shaped pattern defect having the great defect density, large number and wide distribution range such as a flaw formed by handling. Consequently, the steps of generation of the pattern defects, the number of the generated pattern defects and the position of generation are recognized erroneously.

For the above-mentioned reason, it is preferable that the merge set value should be set to 0.25 to 1.5 $\mu$m.

In the first to fourth embodiments, the predetermined range where the failed patterns are retrieved may be a circular or square range.

(Fifth Embodiment)

A fifth embodiment will be described below with reference to FIG. 11. The fifth embodiment accomplishes the third object described above.

Figure 11:
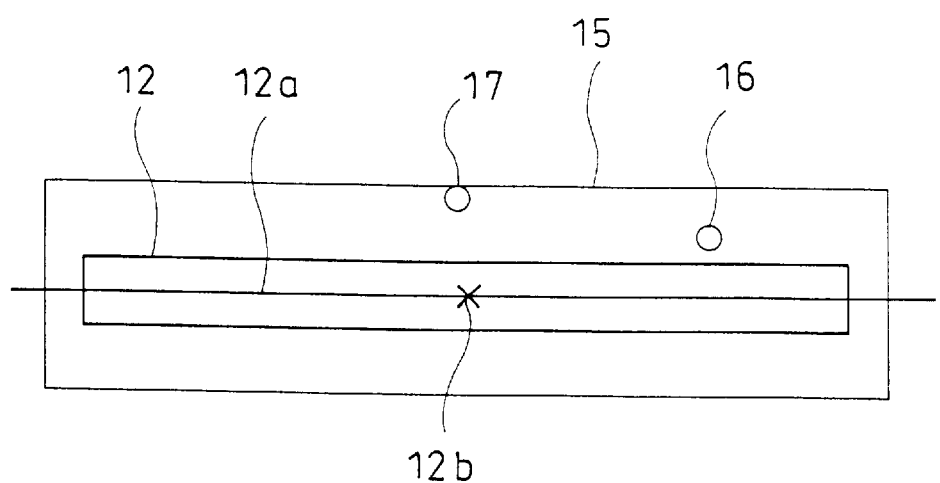
FIG. 11 is a diagram showing the method for specifying pattern defects which cause a line failure portion on the fail bit map in the method for analyzing the failure of a semiconductor wafer according to the present invention.

FIG. 11 is a diagram showing the method for comparing a line failure portion 12 with a pattern defect map. In FIG. 11, the reference numeral 15 designates a retrieval region where pattern defects that cause the generation of the line failure portion 12 are retrieved. For example, the retrieval region 15 is set to 50 $\mu$m or less from a central line 12a of the line failure portion 12 to both sides thereof in consideration of the coordinate specifying precision of a failure analyzing apparatus. A pattern defect 16 present in the retrieval region 15 which is closer to the central line 12a of the line failure portion 12 is specified as a defect which causes line failures.

In the method according to the prior art, the pattern defect 17 which is closer to the central point 12b of the line failure portion 12 was specified as a pattern defect which causes failures. Although the pattern defect 16 actually caused line failures, it was erroneously decided that the pattern defect 17 causes the line failures. According to the fifth embodiment, however, it is decided that the pattern defect 16 which is closer to the central line 12a of the line failure portion 12 causes the line failures. Consequently, a pattern defect which causes the line failures can be specified accurately.

(Sixth Embodiment)

Figure 12:
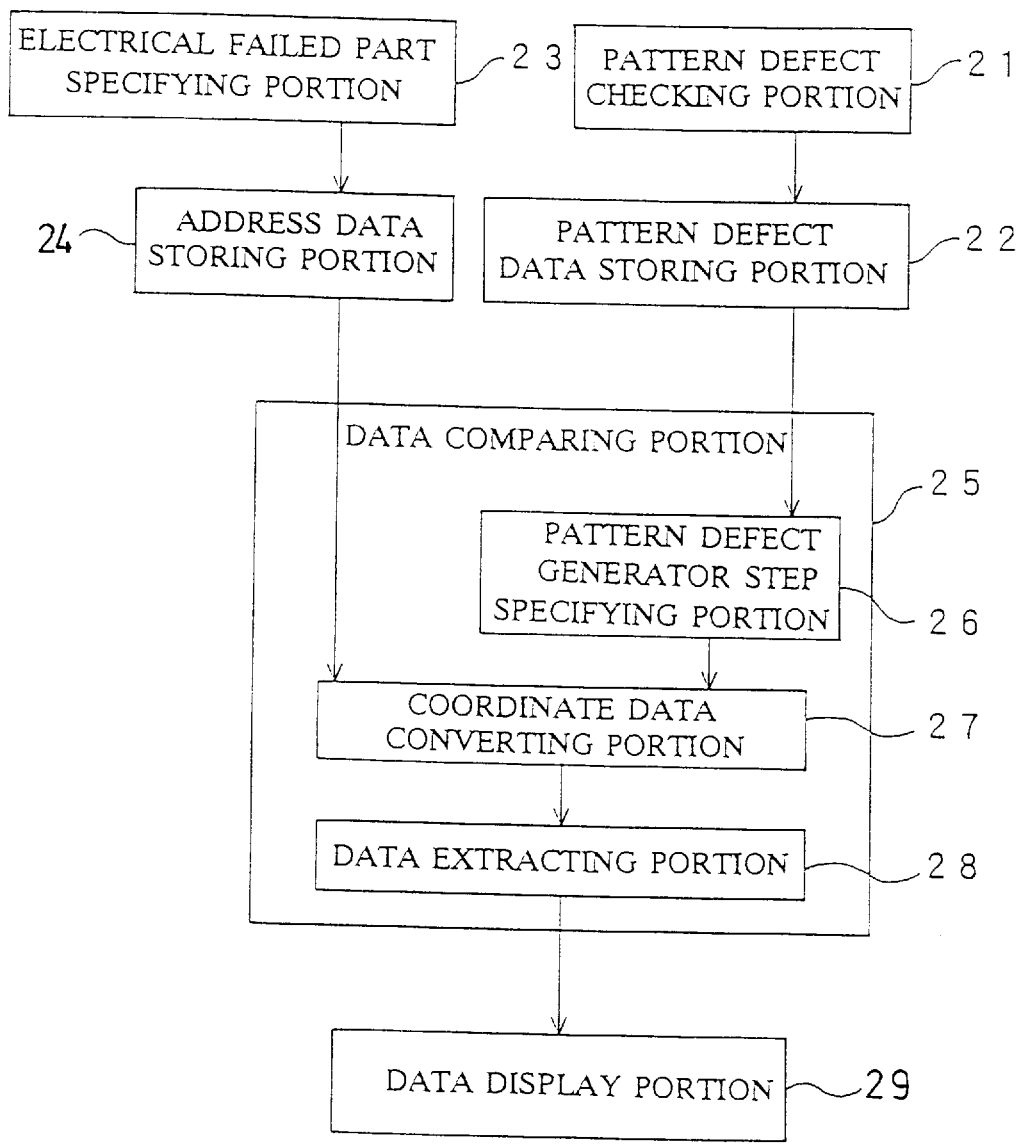
FIG. 12 is a block diagram showing the whole structure of an apparatus for analyzing the failure of a semiconductor wafer according to the present invention.

A sixth embodiment will be described below with reference to FIG. 12. The six embodiment provides a failure analyzing apparatus which implements the first to fifth embodiments.

A pattern defect checking portion 21 retrieves a pattern defect every step for a wafer which is being processed, and makes, for each step, a pattern defect map which indicates the position of the pattern defect.

A pattern defect data storing portion 22 stores a pattern defect map for each step which is made by the pattern defect checking portion 21.

An electrical failed part specifying portion 23 checks electrical characteristics for a device which has been processed, and makes a fail bit map which represents the distribution of electrical defects of a wafer.

An address data storing portion 24 stores address data on the fail bit map made by the electrical failed part specifying portion 23.

A data comparing portion 25 compares pattern defect data stored in the pattern defect data storing portion 22 with the address data on the fail bit map stored in the address data storing portion 24. The data comparing portion 25 comprises a pattern defect generation step specifying portion 26, a coordinate data converting portion 27 and a data extracting portion 28.

The data comparing portion 25 receives the input of the pattern defect data from the pattern defect data storing portion 22, and specifies the generation step of each pattern defect based on the methods described in the first to fourth embodiments, for example.

The coordinate data converting portion 27 converts, into the same coordinate system, data on the generation step of the pattern defect input from the pattern defect generation step specifying portion 26 and the address data on the fail bit map input from the address data storing portion 24.

The data extracting portion 28 specifies a pattern defect which causes electrical failed parts based on the data on the generation step of the pattern defect and the address data on the fail bit map which are converted into the same coordinate system and, for example, the method according to the fifth embodiment, and creates pattern defect data.

Figure 13:
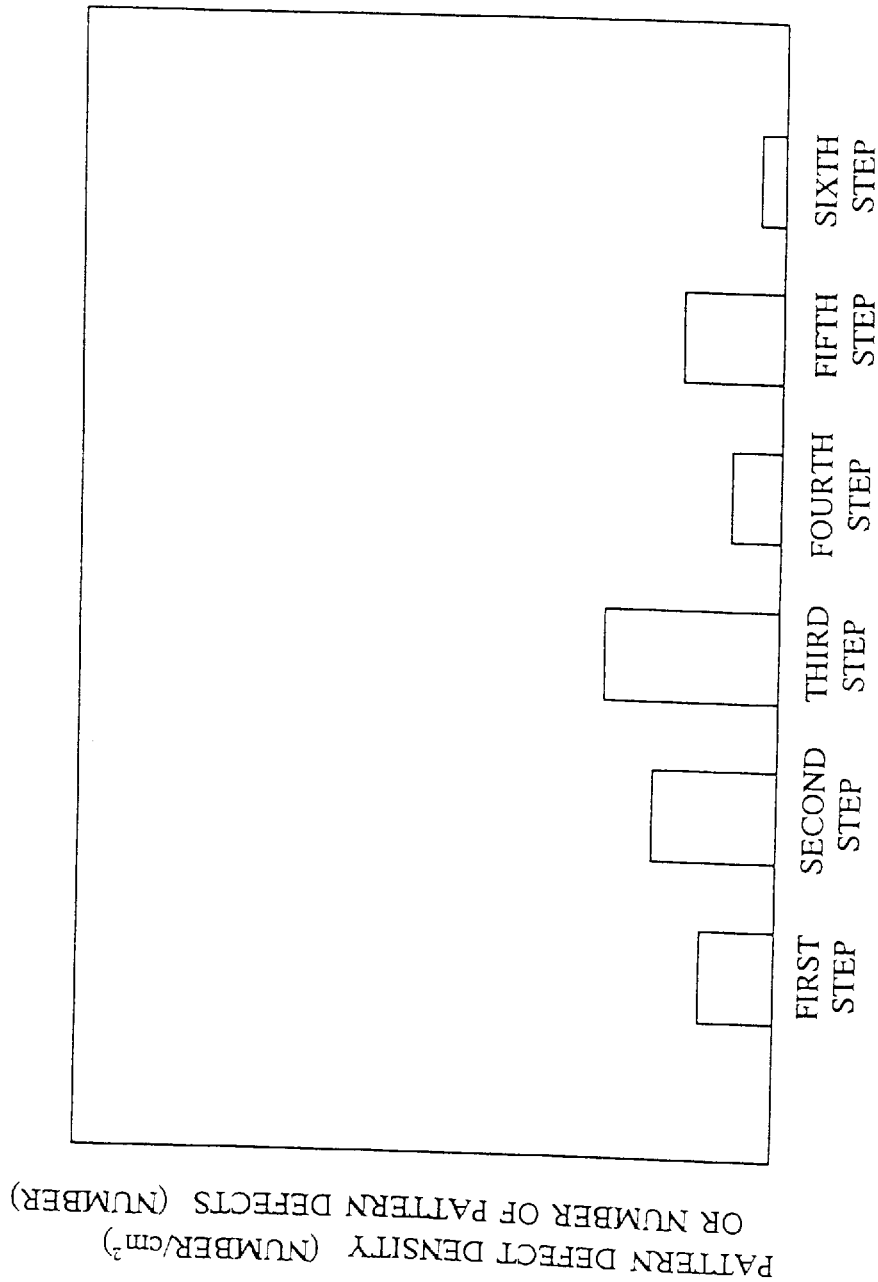
FIG. 13 is a chart showing an example of the contents displayed by a display portion of the apparatus for analyzing the failure of a semiconductor wafer according to the present invention.

A data display portion 29 displays the pattern defect data created by the data extracting portion 28. FIG. 13 shows an example of a graph displayed by the data display portion 29, in which the density and number of pattern defects which cause electrical failures can be indicated for each step. It is apparent from the graph that the number of the pattern defects which cause the electrical failures is the largest at the third step and measures should be taken on a priority basis.

(Seventh Embodiment)

Figure 14A:
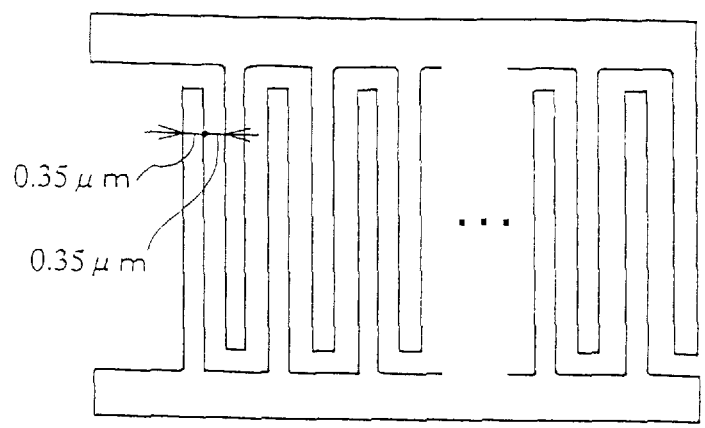
FIGS. 14 (a) and 14 (b) are wiring TEG diagrams in which a line and space is 0.35 $\mu$m and 0.6 $\mu$m, respectively.
Figure 14B:
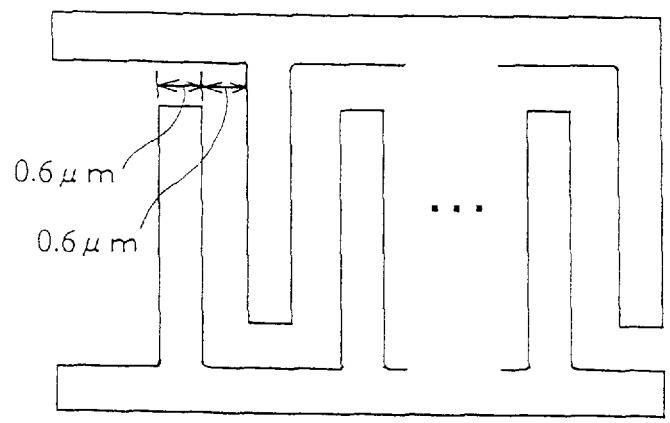

A seventh embodiment will be described below with reference to FIGS. 14 (a) and 14 (b) and FIGS. 15 (a) and 15 (b). The seventh embodiment accomplishes the fourth object described above.

In the seventh embodiment, weighing is executed depending on the size of a pattern defect for a distance between the pattern defect and the center of a failed bit or the central line of a line failure portion.

More specifically, a probability a that the pattern defect causes failures is found in advance for each processing device or step and for each size of the pattern defect. A distance $L_0$ between the pattern defect and the center of the failed bit or the central line of the line failure portion is multiplied by the probability α. A pattern defect having the smallest product (a corrected distance which depends on the cause of failures) is specified as a pattern defect which causes the bit failure portion.

For example, a distance between a first pattern defect having a size A and the center of a failed bit or the central line of a line failure portion is expressed by $L_{A0}$, a probability that the first pattern defect having a size A causes failures is expressed by $\alpha_A$, a distance between a second pattern defect having a size B and the center of a failed bit or the central line of a line failure portion is expressed by $L_{B0}$, a probability that the second pattern defect having a size B causes failures is expressed by $\alpha_B$, a distance between a third pattern defect having a size C and the center of a failed bit or the central line of a line failure portion is expressed by $L_{C0}$, and a probability that the third pattern defect having a size C causes failures is expressed by $\alpha_C$ so as to perform the following calculation. After the calculation, the smallest corrected distance $L_A$, $L_B$ or $L_C$ is obtained. A pattern defect corresponding to the smallest corrected distance $L_A$, $L_B$ or $L_C$ is specified as a pattern defect which causes bit failures.

Corrected distance $L_A = L_{A0} \times 1/\alpha_A$
Corrected distance $L_B = L_{B0} \times 1/\alpha_B$
Corrected distance $L_C = L_{C0} \times 1/\alpha_C$ The probability that the pattern defects having the sizes A, B and C cause the failures is varied depending on the size of a line and space. FIG. 14 (a) is a wiring TEG diagram in which a line and space is 0.35 μm, and FIG. 14 (b) is a wiring TEG diagram in which the line and space is 0.6 μm. FIG. 15 (a) is a graph showing the relationship between the size of a pattern defect on a wiring having a line and space of 0.35 μm and a probability of the cause of failures, and FIG. 15 (b) is a graph showing the relationship between the size of a pattern defect on a wiring having a line and space of 0.6 μm and the probability of the cause of failures. The pattern defects are observed by means of a SEM or the like to plot the relationship between the size of the pattern defect and the probability of the cause of failures and to perform spline approximation for the distribution of the size of the pattern defect and the probability of the cause of failures. Thus, the graphs shown in FIGS. 15 (a) and 15 (b) are made.

Figure 15A:
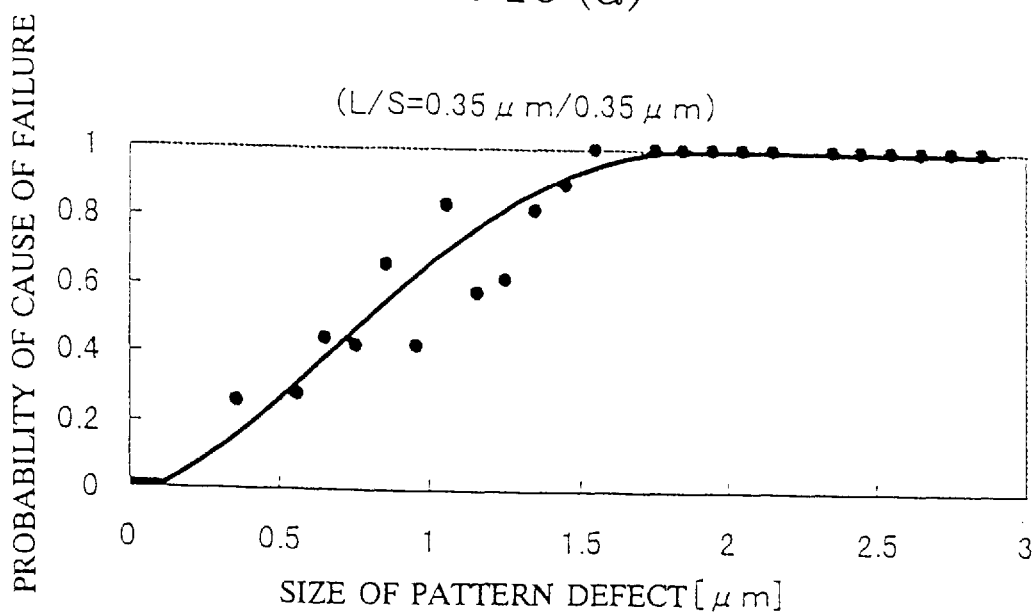
FIGS. 15 (a) and 15 (b) are characteristic charts showing the relationship between the size of a pattern defect and the probability of the cause of failures in the case where the line and space is 0.35 $\mu$m and 0.6 $\mu$m, respectively.
Figure 15B:
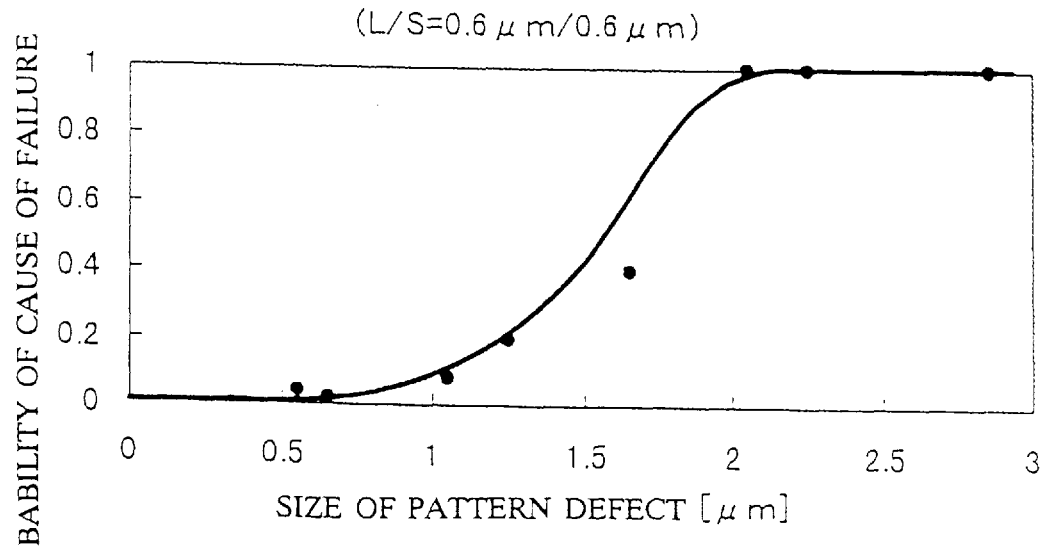
Figure 16:
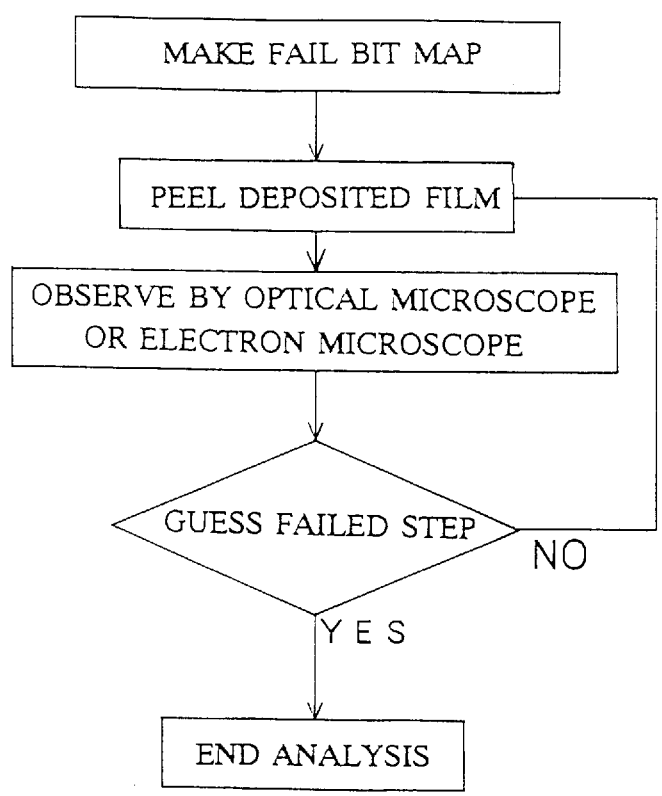
FIG. 16 is a flow chart showing the method for analyzing failures according to the prior art.

As is apparent from the comparison between the graphs shown in FIGS. 15 (a) and 15 (b), the relationship between the size of the pattern defect and the probability of the cause of failures is varied depending on the line and space. Accordingly, it is preferable that the probability that the pattern defect causes the failures should be obtained from the graph corresponding to a line and space in the actual semiconductor process.

According to the seventh embodiment described above, the weighing is executed depending on the size of the pattern defect for the distance between the pattern defect and the center of the failed bit or the central line of the line failure portion so that the pattern defect having the smallest weighed distance is specified as the defect which causes the failures. The weighing is performed by multiplying the distance between the pattern defect and the center of the failed bit or the central line of the line failure portion by an inverse number of the probability that the pattern defect causes the failures.

In the case where a large pattern defect is present in a position at a relatively great distance from the failed bit in a region within a predetermined distance from the failed bit and a small pattern defect is present in a position at a relatively small distance from the failed bit in a region within a predetermined distance from the failed bit, the small pattern defect present at the relatively small distance is erroneously recognized as the cause of the failed bit by the failure analyzing method according to the prior art. According to the seventh embodiment, however, the weighing is executed depending on the size of the pattern defect for the distance between the pattern defect and the failed bit. Consequently, the great pattern defect present at the relatively great distance from the failed bit is specified as the cause of the failed bit. Thus, it is hard to erroneously recognize the pattern defect which causes the failed bit.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A method for analyzing the failure of a semiconductor wafer comprising:

a first step of checking the pattern defect of said semiconductor wafer to make a pattern defect map which represents the distribution of the pattern defects at each process of semiconductor manufacture;

a second step of making a fail bit map which represents the distribution of electrical defects after said each process of semiconductor manufacture is completed; and a third step of specifying a process at which a pattern defect that causes said electrical defects is generated by comparing said pattern defect map made at said first step with said fail bit map made at said second step, said third step including the step of retrieving pattern defects on a first pattern defect map made at the (n−1)th process and a second pattern defect map made at the n-th process to decide that all the pattern defects detected on said second pattern defect map in a predetermined region within a predetermined distance from the position of each pattern defect detected on said first pattern defect map are generated at a process prior to the (n−1)th process, and that pattern defects detected on said second pattern defect map in other regions than said each predetermined region are generated at said n-th process.

2. A method for analyzing the failure of a semiconductor wafer comprising:

a first step of checking the pattern failure of said semiconductor wafer to make a pattern defect map which represents the distribution of the pattern defects at each process of semiconductor manufacture;

a second step of making a fail bit map which represents the distribution of electrical defects after said each process of semiconductor manufacture is completed; and a third step of specifying a process at which a pattern defect that causes said electrical defects is generated by comparing said pattern defect map made at said first step with said fail bit map made at said second step, said third step including the step of retrieving pattern defects on a first pattern defect map made at the (n−1)th process and a second pattern defect map made at the n-th process respectively to decide that the pattern defects on said second pattern defect map which are not detected on said first pattern defect map in each predetermined region within a predetermined distance from the position of said pattern defect detected on said second pattern defect map are generated at the n-th process, and that said pattern defects on said second pattern defect map detected on said first pattern defect map in said each predetermined region are generated at a process, prior to said (n−1)th process.

3. A method for analyzing the failure of a semiconductor wafer comprising:

a first step of checking the pattern defect of said semiconductor wafer to make a pattern defect map which represents the distribution of the pattern defects at each process of semiconductor manufacture;

a second step of making a fail bit map which represents the distribution of electrical defects after said each process of semiconductor manufacture is completed; and a third step of specifying a process at which a pattern defect that causes said electrical defects is generated by comparing said pattern defect map made at said first step with said fail bit map made at said second step, said third step including the step of retrieving the pattern defects on said pattern defect map to merge, as a pattern defect, one of a plurality of pattern defects and other pattern defects detected in a region within a distance of 0.25 to 1.5 $\mu$m from said pattern defect if said plurality of pattern defects are detected.

4. A method for analyzing the failure of a semiconductor wafer comprising:

a first step of checking the pattern defect of said semiconductor wafer to make a pattern defect map which represents the distribution of the pattern defects at each process of semiconductor manufacture;

a second step of making a fail bit map which represents the distribution of electrical defects after said each process of semiconductor manufacture is completed; and a third step of specifying a process at which a pattern defect that causes said electrical defects is generated by comparing said pattern defect map made at said first step with said fail bit map made at said second step, said third step including the step of deciding that a pattern defect located closest to the central line of a line failure portion having a plurality of continuous failed bits, which is detected in a region within a predetermined distance from said central line of said line failure portion on said pattern defect map, causes the generation of said line failure portion if said line failure portion is detected on said fail bit map.

5. A method for analyzing the failure of a semiconductor wafer comprising:

a first step of checking the pattern defect of said semiconductor wafer to make a pattern defect map which represents the distribution of the pattern defects at each process of semiconductor manufacture;

a second step of making a fail bit map which represents the distribution of electrical defects after said each process of semiconductor manufacture is completed; and a third step of specifying a process at which a pattern defect that causes said electrical defects is generated by comparing said pattern defect map made at said first step with said fail bit map made at said second step, said third step including the steps of:

obtaining, in advance, the relationship between the size of a pattern defect and a probability that a pattern defect causes electrical defects; and multiplying a distance between a plurality of pattern defects detected in a region within a predetermined distance from the center of a failed bit on said fail bit map or the central line of a line failure portion formed by a plurality of continuous failed bits and said center of said failed bit or said central line of said line failure portion by an inverse number of said probability corresponding to said size of said pattern defect detected in said region within a predetermined distance so as to find corrected distances respectively and to decide that a pattern defect corresponding to said corrected distance having the smallest value causes electrical defects.

6. An apparatus for analyzing the failure of a semiconductor wafer comprising:

pattern defect map making means for checking the pattern defect of said semiconductor wafer to make a pattern defect map which represents the distribution of the pattern defects at each process of semiconductor manufacture;

fail bit map making means for making a fail bit map which represents the distribution of electrical defects after said each process of semiconductor manufacture is completed; and pattern defect generation step specifying means for specifying a process at which a pattern defect that causes said electrical defects is generated by comparing said pattern defect map made by said pattern defect map making means with said fail bit map made by said fail bit map making means, said pattern defect generation step specifying means including:

means for retrieving pattern defects on a first pattern defect map made at the (n−1)th process and a second pattern defect map made at the n-th process respectively; and means for deciding that all the pattern defects detected on said second pattern defect map in each predetermined region within a predetermined distance from the position of each pattern defect detected on said first pattern defect map are generated at a process prior to the (n−1)th process, and that pattern defects detected on said second pattern defect map in other regions than said each predetermined region are generated at said n-th process.

7. An apparatus for analyzing the failure of a semiconductor wafer comprising:

pattern defect map making means for checking the pattern defect of said semiconductor wafer to make a pattern defect map which represents the distribution of the pattern defects at each process of semiconductor manufacture;

fail bit map making means for making a fail bit map which represents the distribution of electrical defects after said each process of semiconductor manufacture is completed; and pattern defect generation step specifying means for specifying a process at which a pattern defect that causes said electrical defects is generated by comparing said pattern defect map made by said pattern defect map making means with said fail bit map made by said fail bit map making means, said pattern defect generation step specifying means including:

means for retrieving pattern defects on a first pattern defect map made at the (n−1)th process and a second pattern defect map made at the n-th process respectively; and means for deciding that pattern defects on said second pattern defect map which are not detected on said first pattern defect map in each predetermined region within a predetermined distance from the position of said pattern defect detected on said second pattern defect map are generated at the n-th process, and that the pattern defects on said second pattern defect map detected on said first pattern defect map in said each predetermined region are generated at a process prior to said (n−1)th process.

8. An apparatus for analyzing the failure of a semiconductor wafer comprising:

pattern defect map making means for checking the pattern defect of said semiconductor wafer to make a pattern defect map which represents the distribution of the pattern defects at each process of semiconductor manufacture;

fail bit map making means for making a fail bit map which represents the distribution of electrical defects after said each process of semiconductor manufacture is completed; and pattern defect generation step specifying means for specifying a process at which a pattern defect that causes said electrical defects is generated by comparing said pattern defect map made by said pattern defect map making means with said fail bit map made by said fail bit map making means, said pattern defect generation step specifying means including means for retrieving pattern defects on said pattern defect map to merge, as a pattern defect, one of a plurality of pattern defects and other pattern defects detected in a region within a distance of 0.25 to 1.5 $\mu$m from said pattern defect if said plurality of pattern defects are detected.

9. An apparatus for analyzing the failure of a semiconductor wafer comprising:

pattern defect map making means for checking the pattern defect of said semiconductor wafer to make a pattern defect map which represents the distribution of the pattern defects at each process of semiconductor manufacture;

fail bit map making means for making a fail bit map which represents the distribution of electrical defects after said each process of semiconductor manufacture is completed; and pattern defect generation step specifying means for specifying a process at which a pattern defect that causes said electrical defects is generated by comparing said pattern defect map made by said pattern defect map making means with said fail bit map made by said fail bit map making means, said pattern defect generation step specifying means including means for deciding that a pattern defect located closest to the central line of a line failure portion having a plurality of continuous failed bits, which is detected in a region within a predetermined distance from said central line of said line failure portion on said pattern defect map, causes the generation of said line failure portion if said line failure portion is detected on said fail bit map.

10. An apparatus for analyzing the failure of a semiconductor wafer comprising:

pattern defect map making means for checking the pattern defect of said semiconductor wafer to make a pattern defect map which represents the distribution of the pattern defects at each process of semiconductor manufacture;

fail bit map making means for making a fail bit map which represents the distribution of electrical defects after said each process of semiconductor manufacture is completed; and pattern defect generation step specifying means for specifying a process at which a pattern defect that causes said electrical defects is generated by comparing said pattern defect map made by said pattern defect map making means with said fail bit map made by said fail bit map making means, said pattern defect generation step specifying means including:

means for obtaining, in advance, the relationship between the size of a pattern defect and a probability that a pattern defect causes electrical defects; and means for multiplying a distance between a plurality of pattern defects detected in a region within a predetermined distance from the center of a failed bit on said fail bit map or the central line of a line failure portion formed by a plurality of continuous failed bits and said center of said failed bit or said central line of said line failure portion by an inverse number of said probability corresponding to said size of said pattern defect detected in said region within a predetermined distance so as to find corrected distances respectively and to decide that a pattern defect corresponding to said corrected distance having the smallest value causes electrical defects.

* * * * *